(12) United States Patent
Ross et al.

(10) Patent No.: US 9,095,070 B2
(45) Date of Patent: Jul. 28, 2015

(54) PARTIAL-WIDTH RACK-MOUNTED COMPUTING DEVICES

(75) Inventors: Peter G. Ross, Olympia, WA (US); Darin Lee Frink, Lake Tapps, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 13/311,231

(22) Filed: Dec. 5, 2011

(65) Prior Publication Data

US 2013/0141863 A1     Jun. 6, 2013

(51) Int. Cl.
| H05K 5/00 | (2006.01) |
| H05K 7/00 | (2006.01) |
| E04G 3/00 | (2006.01) |
| H05K 7/14 | (2006.01) |
| G11B 33/12 | (2006.01) |

(52) U.S. Cl.
CPC ............ *H05K 7/1489* (2013.01); *G11B 33/128* (2013.01)

(58) Field of Classification Search
CPC ..... G11B 33/126; H05K 7/1489; G06F 1/187
USPC ................ 361/688–727, 679.01–679.04, 361/679.33–679.39, 676–678, 361/679.46–679.59; 312/223.1, 223.2, 312/223.3
See application file for complete search history.

(56) References Cited

U.S. PATENT DOCUMENTS

| 3,481,485 A | 12/1969 | Hess |
| 3,807,572 A | 4/1974 | Luvara et al. |
| 4,328,897 A | 5/1982 | Weiss |
| 5,806,438 A | 9/1998 | Beaudet |
| 5,871,396 A | 2/1999 | Shen |
| 6,039,190 A | 3/2000 | Clausen |
| 6,259,605 B1 | 7/2001 | Schmitt |
| 6,469,899 B2 | 10/2002 | Hastings et al. |
| 6,496,366 B1 | 12/2002 | Coglitore et al. |
| 6,545,850 B1 | 4/2003 | Shearman et al. |
| 6,590,768 B1 | 7/2003 | Wiley |
| 6,603,661 B2 | 8/2003 | Smith et al. |
| 6,621,693 B1 | 9/2003 | Potter et al. |
| 6,675,976 B2 | 1/2004 | Steinman et al. |
| 6,754,082 B1 | 6/2004 | Ding et al. |
| 6,791,836 B2 | 9/2004 | Cipolla et al. |
| 6,795,314 B1 | 9/2004 | Arbogast et al. |
| 6,822,859 B2 | 11/2004 | Coglitore et al. |
| 6,833,995 B1 | 12/2004 | Hsue et al. |

(Continued)

FOREIGN PATENT DOCUMENTS

EP         2202751        6/2010

OTHER PUBLICATIONS

D-Link Corp. DES-1024D, Nov. 22, 2010, D-Link Corp.*

(Continued)

*Primary Examiner* — Jerry Wu

(74) *Attorney, Agent, or Firm* — Robert C. Kowert; Meyertons, Hood, Kivlin, Kowert & Goetzel, P.C.

(57) ABSTRACT

A computing device includes a chassis having a width that is equal to or less than half of the width of a standard slot of a rack. A circuit board assembly with at least one processor is coupled to the chassis in a primarily horizontal orientation. One or more rows of mass storage devices (such as hard disk drives) are coupled to the chassis. At least one of the rows of mass storage devices includes a stack of mass storage devices.

36 Claims, 9 Drawing Sheets

(56) References Cited

U.S. PATENT DOCUMENTS

| | | | |
|---|---|---|---|
| 7,031,154 | B2 | 4/2006 | Bash et al. |
| 7,042,422 | B2 | 5/2006 | Weitbruch et al. |
| 7,068,509 | B2 | 6/2006 | Bash et al. |
| 7,238,104 | B1 | 7/2007 | Greenslade et al. |
| 7,283,358 | B2 | 10/2007 | Campbell et al. |
| 7,361,081 | B2 | 4/2008 | Beitelmal et al. |
| 7,379,299 | B2 | 5/2008 | Walsh et al. |
| 7,403,390 | B2 | 7/2008 | Franz et al. |
| 7,408,775 | B2 | 8/2008 | Walz et al. |
| 7,499,286 | B2 | 3/2009 | Berke et al. |
| 7,599,183 | B2 | 10/2009 | Dittus et al. |
| 7,660,116 | B2 | 2/2010 | Claassen et al. |
| 7,660,117 | B2 | 2/2010 | Werner et al. |
| 7,701,710 | B2 | 4/2010 | Tanaka et al. |
| 7,719,835 | B1 | 5/2010 | Schluter |
| 7,746,634 | B2 | 6/2010 | Hom et al. |
| 7,768,780 | B2 | 8/2010 | Coglitore et al. |
| 7,768,787 | B2 | 8/2010 | Vaughan et al. |
| 7,862,410 | B2 | 1/2011 | Mcmahan et al. |
| 7,869,210 | B2 | 1/2011 | Moss |
| 7,878,888 | B2 | 2/2011 | Rasmussen et al. |
| 7,944,700 | B2 | 5/2011 | Wang et al. |
| 7,990,700 | B2 | 8/2011 | Guo |
| 8,087,979 | B2 | 1/2012 | Rasmussen |
| 2002/0134531 | A1* | 9/2002 | Yanagida ............... 165/80.3 |
| 2002/0181194 | A1 | 12/2002 | Ho et al. |
| 2004/0032722 | A1 | 2/2004 | Wrycraft et al. |
| 2004/0218355 | A1 | 11/2004 | Bash et al. |
| 2004/0233643 | A1 | 11/2004 | Bolich et al. |
| 2005/0166860 | A1 | 8/2005 | Austin et al. |
| 2005/0237716 | A1 | 10/2005 | Chu et al. |
| 2005/0257232 | A1* | 11/2005 | Hidaka ................... 720/654 |
| 2005/0265004 | A1 | 12/2005 | Coglitore et al. |
| 2006/0061955 | A1 | 3/2006 | Imblum |
| 2006/0250766 | A1* | 11/2006 | Blaalid et al. ............. 361/685 |
| 2006/0274496 | A1 | 12/2006 | Lee et al. |
| 2006/0290245 | A1* | 12/2006 | Hidaka ................... 312/223.1 |
| 2008/0013275 | A1 | 1/2008 | Beckley et al. |
| 2008/0043427 | A1 | 2/2008 | Lee et al. |
| 2008/0112127 | A1 | 5/2008 | June et al. |
| 2008/0191590 | A1 | 8/2008 | Lin et al. |
| 2008/0285232 | A1 | 11/2008 | Claassen et al. |
| 2009/0086441 | A1 | 4/2009 | Randall et al. |
| 2009/0109609 | A1 | 4/2009 | Lai et al. |
| 2009/0260384 | A1 | 10/2009 | Champion et al. |
| 2009/0296322 | A1 | 12/2009 | Yang et al. |
| 2010/0049893 | A1* | 2/2010 | Drako ..................... 710/301 |
| 2010/0271766 | A1 | 10/2010 | Lin |
| 2011/0149508 | A1 | 6/2011 | Malekmadani |
| 2011/0284422 | A1 | 11/2011 | Yamada |
| 2012/0092811 | A1 | 4/2012 | Chapel et al. |
| 2012/0303940 | A1* | 11/2012 | Grice et al. ............... 713/1 |

OTHER PUBLICATIONS

U.S. Appl. No. 12/717,282, filed Mar. 4, 2010, Peter G Ross.
U.S. Appl. No. 12/751,206, filed Mar. 31, 2010, Michael W Schrempp.
U.S. Appl. No. 12/886,437, filed Sep. 20, 2010, Peter G Ross.
U.S. Appl. No. 12/886,440, filed Sep. 20, 2010, Peter G Ross.
U.S. Appl. No. 12/886,472, filed Sep. 20, 2010, Peter G Ross.
U.S. Appl. No. 12/886,469, filed Sep. 20, 2010, Peter G Ross.
U.S. Appl. No. 13/327,576, filed Dec. 15, 2011, Peter G Ross.
U.S. Appl. No. 13/327,573, filed Dec. 15, 2011, Peter G Ross.
U.S. Appl. No. 13/327,564, filed Dec. 15, 2011, Matthew T. Corddry.
International Search Report for PCT/US2011/051139, mailed Dec. 6, 2011, Amazon Technologies, Inc., pp. 1-10.
HP "Overview—HP ProLiant SL390s Generation 7 (G7)" Downloaded from http://h18004.www1.hp.com/products/quickspecs/13713_na/13713_na.html on Nov. 3, 2011 pp. 1-39.
Yael Maguire "Reflections on the Open Compute Summit" Facebook.com published Jun. 22, 2011, pp. 1-3.
International Search Report and Written Opinion in application No. PCT/US2012/067340 mailed Apr. 2, 2013 pp. 1-13.

* cited by examiner

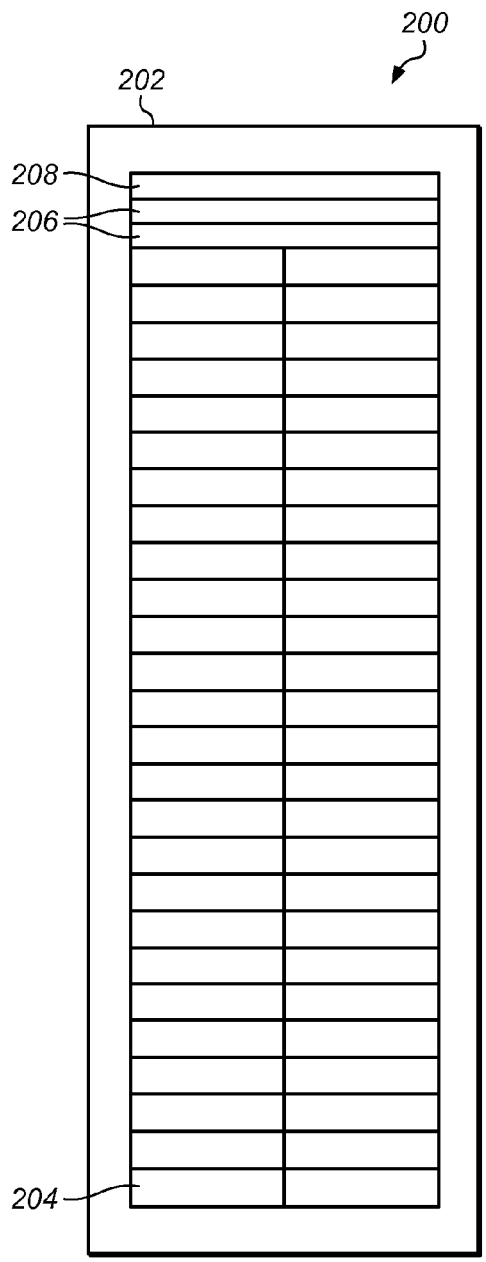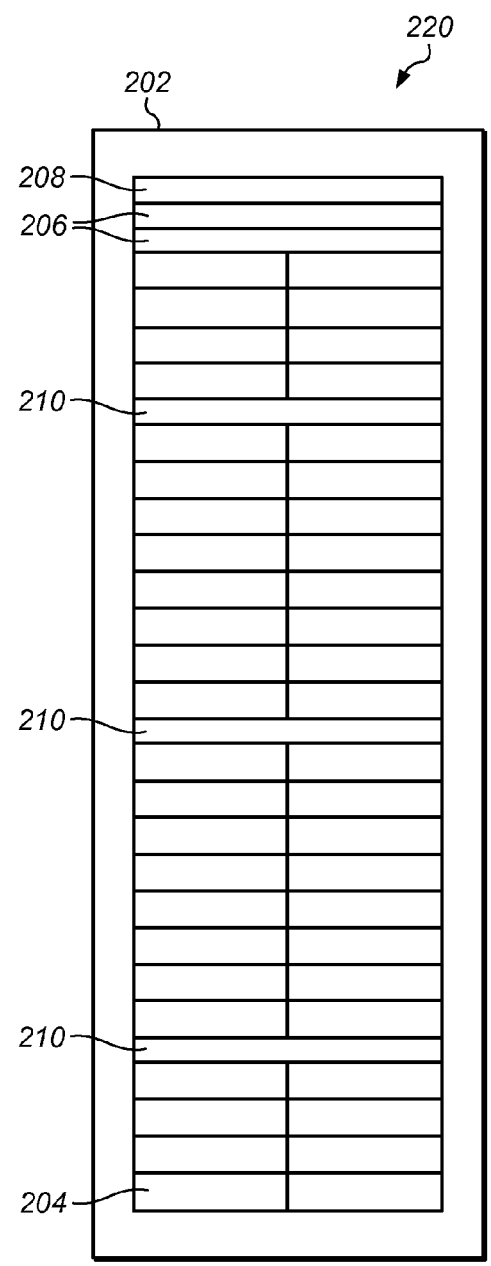
FIG. 10
FIG. 11

PARTIAL-WIDTH RACK-MOUNTED COMPUTING DEVICES

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Many servers are designed to be installed in standard rack, such as a standard 19-inch rack in accordance with Electronic Industries Association EIA-310. A server may have a height that corresponds to spacing standard, such as a "rack unit", as defined in EIA-310. A server may be designed to fit, for example, into a rack slot having a height of one rack unit ("1U"), two rack units ("2U"), or four rack units ("4U"). Each server may include a number of hard disk drives (for example, two or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs where hard disk drives conforming to one standard are employed in a server chassis whose dimensions conform to another standard, the arrangement of the hard disk drives may leave a substantial amount of wasted space in the server chassis. This wasted space, especially when multiplied over many servers in a rack, may result in inadequate computing or storage capacity for a system. Moreover, in some rack systems, the density of computing devices achieved may be too low to utilize all of the resources available within the rack, such as data ports, electrical power, or cooling capacity.

Hard disk drives include motors and electronic components that generate heat. Some or all of this heat must be removed from the hard disk drives to maintain continuous operation of a server. The amount of heat generated by the hard disk drives within a data room may be substantial, especially if all of the hard disk drives are fully powered up at all times.

As with other components, hard disk drives fail from time to time while in service. These failures reduce the storage capacity of a system. To restore capacity, servers may need to be powered down and removed from a rack so that the defective hard disk drives can be replaced or repaired.

BRIEF DESCRIPTION OF THE DRAWINGS

FIG. 10 illustrates one embodiment of a computing system including rack-mounted half-width computing devices and related rack mounted devices in a rack.

FIG. 11 illustrates one embodiment of a computing system having data switch port capacity that matches the number of computing devices in the rack.

Figure 1:
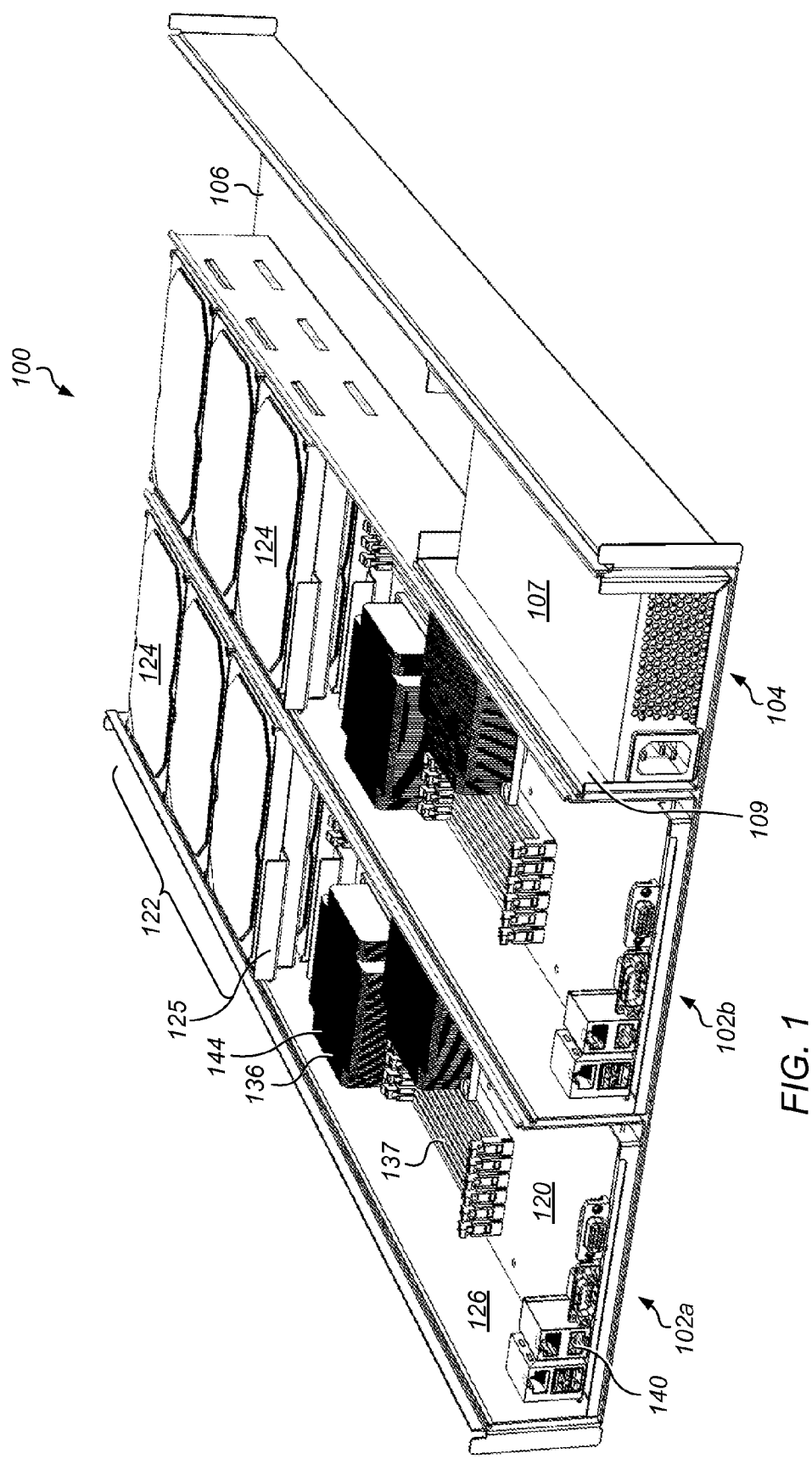
FIG. 1. illustrates one embodiment of a rack-mountable computing system that includes partial-width computing devices on a shelf.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computing systems, and systems and methods for performing computing operations, are disclosed. According to one embodiment, a computing system includes a rack having standard slots for computing devices and computing devices coupled to the rack. One or more of the computing devices includes a chassis, a circuit board assembly in a primarily horizontal orientation, and one or more processors coupled to the circuit board assembly. One or more stacks of hard disk drives are coupled to the chassis. The chassis has a width that is equal to or less than half of the width of one of the standard slots of the rack. The height of the computing device may be about 1.5U.

According to one embodiment, a computing device includes a chassis having a width that is equal to or less than half of the width of a standard slot of a rack. One or more circuit board assemblies with at least one processor are coupled to the chassis in a primarily horizontal orientation. One or more rows of mass storage devices (such as hard disk drives) are coupled to the chassis. At least one of the rows of mass storage devices includes one or more stacks of mass storage devices.

According to one embodiment, a system for holding computing devices in a rack includes one or more mounting portions that couple in standard slots of a rack and one or more shelves coupled to the mounting portions. The shelves include a set of two or more slots. At least some of the slots hold two or more computing devices having primarily horizontal motherboard assemblies in a side-by-side relationship in the rack and such that the computing devices can slide in and out of the shelf system.

According to one embodiment, a system includes a rack, rack-mountable computing devices installed in the rack, and one or more rack-mountable data switch devices installed in the rack. The computing devices have a width that is equal to or less than one-half of the width of a standard rack slot. The computing devices include one or more data input/output connections. The data switch devices include a set of data input/output ports that couple with data input/output connections. The total number of data input/output ports in the set of data input/output ports on the one or more data switches matches number of the input/output connections on the computing devices installed in the rack such that there are no unused data input/output ports on the one or more data switches when the data input/output connections of the computing devices are coupled to the data input/output ports of the one or more data switch devices.

As used herein, "chassis" means a structure or element that supports another element or to which other elements can be mounted. A chassis may have any shape or construction, including a frame, a sheet, a plate, a box, a channel, or a combination thereof. In some embodiments, a chassis is a sled that slides in and out the rack on a shelf or other mounting structure. In one embodiment, a chassis is made from one or more sheet metal parts. A chassis for a computing device may support circuit board assemblies, power supply units, data storage devices, fans, cables, and other components of the computing device.

As used herein, a "half-width computing device" means a computing device that is one-half the width or less of a standard rack slot. For purposes of this definition, the width of a computing device excludes mounting elements that extend laterally beyond the opening in the rack, such as side ears or tabs that contact a vertical mounting post of a rack during use.

As used herein, a "half-width chassis" means a chassis that is one-half the width or less of a standard rack slot. For purposes of this definition, the width of a chassis excludes mounting elements that extend laterally beyond the opening in the rack, such as side ears or tabs that contact a vertical mounting post of a rack during use.

As used herein, a "rack unit" or "U" refers to a measure of standard spacing in a rack. One "rack unit", or "U", is nominally 1.75 inches. As used herein, spacing, dimensions, and pitches based on "rack units" or "U" may allow for tolerances, such as manufacturing tolerances.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

As used herein, "stack" includes any arrangement of elements in which one element is located at least partially above or over another element. For example, a stack of hard disk drives may include two or more hard disk drives arranged one over another. A "stack" does not require that upper elements in the stack rest on the elements lower in the stack. For example, in some embodiments, each level of hard disk drives in a stack of hard disk drives is separately supported by a chassis or tray (for example, ledges in the walls of the chassis at each level of the stack). In addition, a "stack" does not require that elements be precisely aligned vertically with respect to one another. In some cases, a gap may be provided (such as an air gap) between elements in a stack. For example, an air gap may be provided between hard disk drives in a stack of hard disk drives.

As used herein, "standard" means consistent with one or more standards, such as an industry standard. In some embodiments, a standard rack slot is 19 inches wide.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, an "aisle" means a space next to one or more elements, devices, or racks.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to devices including a processor, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "primarily horizontal" means more horizontal than vertical. In the context of an installed element or device, "primarily horizontal" includes an element or device whose installed width is greater than its installed height.

As used herein, "primarily vertical" means more vertical than horizontal. In the context of an installed element or device, "primarily vertical" includes an element or device whose installed height is greater than its installed width.

As used herein, a "rack" means a rack, container, frame, or other element or combination of elements that can contain or physically support one or more computing devices.

As used herein, "room" means a room or a space of a building. As used herein, "computer room" means a room of a building in which computing devices, such as rack-mounted servers, are operated.

As used herein, a "space" means a space, area or volume.

In some embodiments, a computing system includes a computing device with horizontally oriented circuit boards on chassis having a width that is half the width or less of a standard slot in a rack. The chassis may be, for example, half the width or less of a slot of a standard 19-inch rack in accordance with Electronic Industries Association EIA-310. Each computing device may be provided on a separate chassis. Two computing device can be placed side-by-side at each of various levels in the rack. Each computing device may include one or more stacks of mass storage devices, such as hard disk drives. The height of the half width computing devices is more than 1U. In one embodiment, the height of each computing device is about 1.5U.

FIG. 1. illustrates one embodiment of a rack-mountable computing system that includes two partial-width computing devices on a common shelf. Computing system 100 includes computing device 102a, computing device 102b, and power module 104, and shelf 106. Computing device 102a, computing device 102b, and power module 104 are supported on shelf 106. Each of computing device 102a and computing device 102b has a separate chassis 126. Power supply unit 107 is supported on power supply unit carrier 109. Each of computing device 102a, computing device 102b, and power module 104 can be separately withdrawn from shelf 106, such as by sliding out of the shelf toward the front of the rack.

Each of computing devices 102a and 102b may serve as one or more compute nodes for the system. Each of computing devices 102a and 102b includes motherboard assembly 120 and hard disk drive array 122. Hard disk drive array 122 includes hard disk drives 124.

In some embodiments, hard disk drives 124 are standard, off-the-shelf disk drives. Examples of suitable hard disk drive form factors may include 3.5", 5.25", and 2.5". In one embodiment, a stack of two 3.5 inch hard disk drives is provided at each of the three hard disk drive locations shown in FIG. 1.

Figure 2:
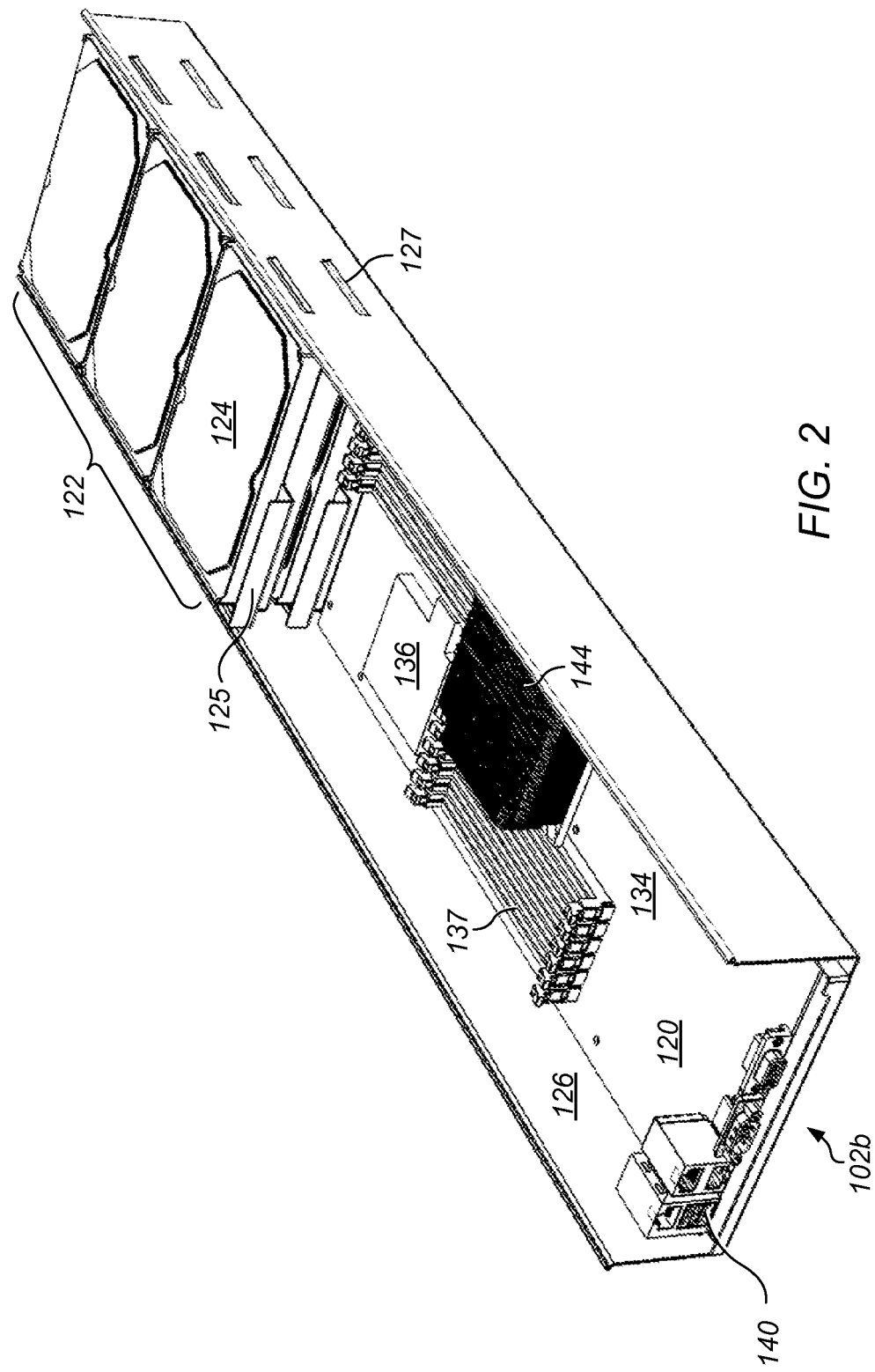
FIG. 2 illustrates one embodiment of a partial-width computing device having a row of stacked hard disk drives.

FIG. 2 illustrates one embodiment of a partial-width computing device including a row of stacked hard disk drives. Motherboard assembly 120 may be coupled to hard disk drives 124 in disk drive array 122. Motherboard assembly 120 may control, and access data on, hard disk drives 124 in disk drive array 122.

In some embodiments, a chassis for a computing device is less than or equal to half the width of a standard 19-inch rack slot. Thus, two computing device may be mounted side-by-side in a full width standard slot of a rack. The width of the motherboard in computing devices 102a and 102b may be less than the width of the chassis. In one embodiment, the width of a motherboard for a computing device is about 6.3 inches.

Motherboard assembly 120 includes circuit board 134, processors 136, heat sinks 144, DIMM slots 137, and I/O connectors 140. Motherboard assembly 120 may include various other semiconductor devices, resistors, and other heat producing components. Motherboard assembly 120, along with other components in chassis 126 (hard disk drives, power supplies) and/or components external to chassis 126, may operate in conjunction with one another as a computing device. For example, computing device 102a may be a file server.

As illustrated in FIGS. 1 and 2, a computing device may have more than one processor. In some embodiments, two or more processors are provided on a single motherboard assembly. In certain embodiments, the processors are staggered across the width of the motherboard assembly. In one embodiment, rows of DIMMs are placed in complementary staggered positions relative to staggered processors. For example, in FIG. 2, staggered rows of DIMMs are located in a complementary arrangement relative to processors 136.

Heat sinks 144 are mounted on processors 136. (In FIG. 2, the rear heat sink has been removed for clarity to show one of processors 136). Heat sinks 144 may transfer heat from processors 136 to air inside chassis 126 during operation of computing devices 102b. DIMMs may be installed in any or all of DIMM slots 137 on motherboard assembly 120.

Figure 3A:
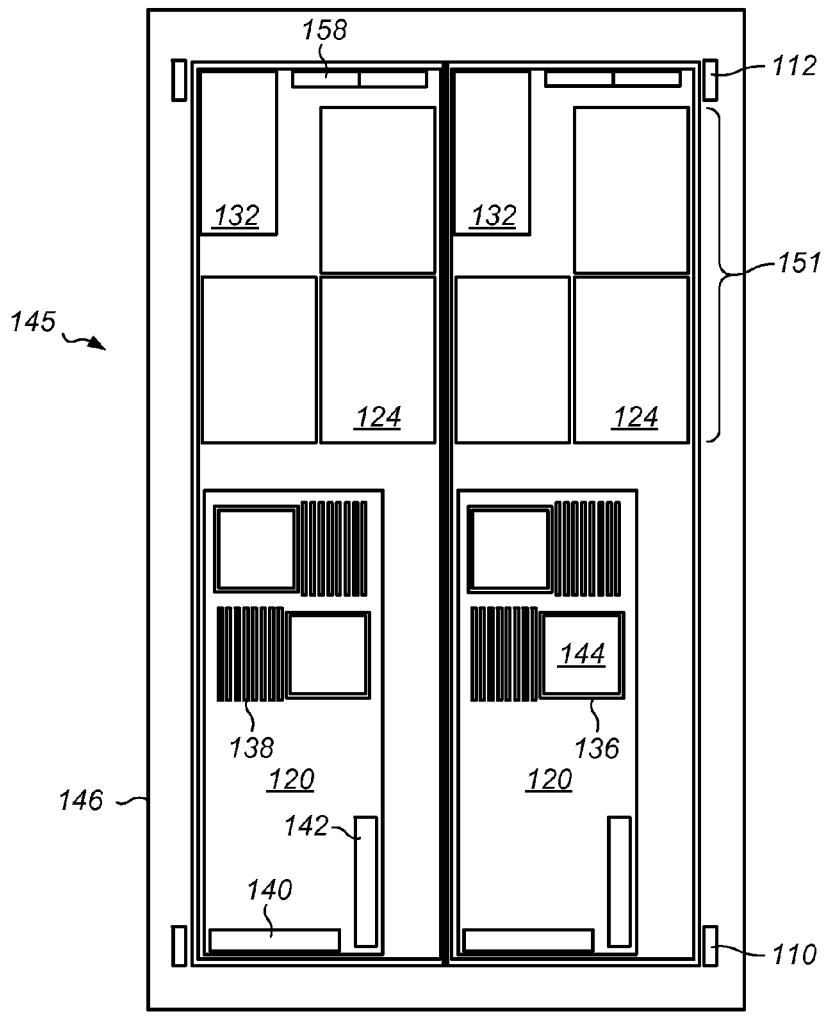
FIGS. 3A and 3B are a top view and a front view, respectively, illustrating one embodiment of a computing system including a rack with computing devices on separately removable, half-width chassis.
Figure 3B:
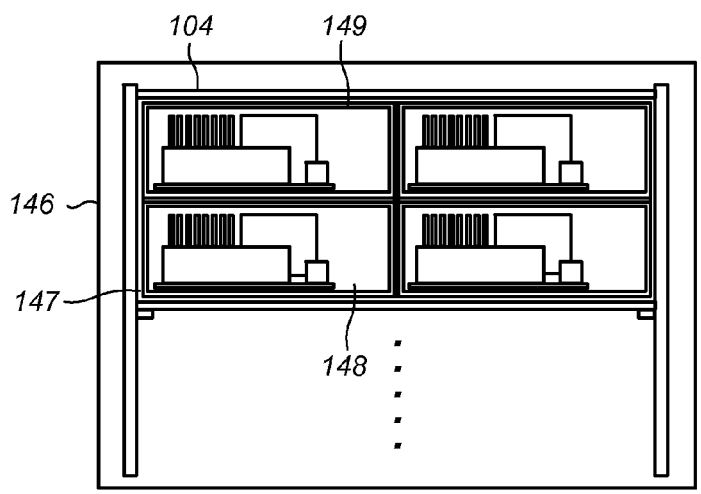

FIGS. 3A and 3B are a top view and a front view, respectively, illustrating one embodiment of a computing system including a rack with computing devices on separately removable, half-width chassis. System 145 includes rack 146, shelf modules 147, and computing devices 148.

Rack 146 includes front posts 110 and rear posts 112. Shelf modules 147 may be rack-mountable in rack 146. Each of shelf modules 147 may be attached to front posts 110 and rear posts 112 in any of various manners, including threaded fasteners, opposing L-rails, brackets, clips, slides, cross-rails, bars or shelves. In one embodiment, a shelf module is supported on opposing left and right L-rails coupled to the front and rear posts of a rack. In one embodiment, rails are installed on the left and right sides of shelf module 147 to engage on corresponding rails, slides, or ledges, on left and right sides of a rack. In certain embodiments, a rail kit may be installed on the sides of the shelf for the computing devices.

Shelf module 147 includes a two-by-two array of half-width slots. One of computing devices 148 may be installed in each of the slots. In one embodiment, shelf module 147 is about 3U in height.

Although in FIGS. 3A and 3B, shelf module 147 is shown with a two by two slot arrangement for illustrative purposes, a shelf module may include any number of rows and columns.

For example, a shelf module may include three rows (three levels of computing devices) and three columns (three computing devices arranged side-by side at each level).

Although only one shelf module and four computing devices are shown in FIG. 3B for clarity, shelf modules and computing devices may be installed to fill any or all of the slots from top to bottom in a rack. For example, in one embodiment, a rack includes 13 shelf modules, with each shelf module holding 4 computing devices, for a total of 52 computing devices. In another embodiment, a rack includes 12 shelf modules, with each shelf module holding 4 computing devices, for a total of 48 computing devices.

Each of computing devices 148 includes motherboard assembly 120, chassis 149, hard disk drives 124, and power supply unit 132. Power supply unit 132 may supply electrical power for motherboard assembly 120, hard disk drives 124, and other components of computing device 106. Motherboard assembly includes processors 136, DIMMs 138, I/O connectors 140, PCI module 142, and heat sink 144.

In various embodiments, a computing device includes a power supply that conforms to an industry-recognized standard. In some embodiments, a power supply for a computing device has a form factor in accordance with an industry-recognized standard. In one embodiment, power supply unit 132 has a standard 1U form factor. Examples of other standards for a power supply and/or a power supply form factor include 2U, 3U, SFX, ATX, NLX, LPX, or WTX.

In some embodiments, a computing device includes a power distribution circuit board instead of, or in addition to, a power supply unit. For example, a power distribution board may be provided instead of power supply unit 132 of computing device 148.

In the embodiment shown in FIGS. 3A and 3B, computing device 148 includes one power supply unit and three stacks of hard disk drives. A computing device may, however, have any number of hard disk drives, power supply units, or other components.

In certain embodiments, a computing device may have one or more internal fans to promote the flow of air through a computing device. For example, in certain embodiments, fans 158 are provided along the rear edge of computing device 148. Fans 158 may move air across heat producing components of computing device 148. In certain embodiments, a computing device may have no fans.

In certain embodiments, a power supply may be external to a computing device. For example, in certain embodiments, motherboard assembly 120 may receive power from a power supply external to computing device 148 (such as a rack-level power supply), and power supply unit 132 may be omitted.

In certain embodiments, a computing device includes mass storage devices that are mounted in two or more different orientations. In one embodiment, a computing device includes one or more hard disk drives mounted in a horizontal orientation and one or more hard disk drives mounted in a vertical orientation.

Motherboard assembly 120, hard disk drives 124, and power supply unit 132 may be attached to chassis 149 in any suitable manner. In one embodiment, the motherboard assemblies, hard disk drives, and are attached to the chassis using screws. In some embodiments, hard disk drives are installed in disk drive carriers that allow each hard disk drive to be separately removed from the carrier while the carrier is installed on the chassis of a computing device.

In some embodiments, chassis 149 encloses one or more of motherboard assembly 120, hard disk drive 124, and fans 158.

In other embodiments, chassis 149 is in the form of a plate or panel on which one or more components of the computing device are mounted.

Figure 4:
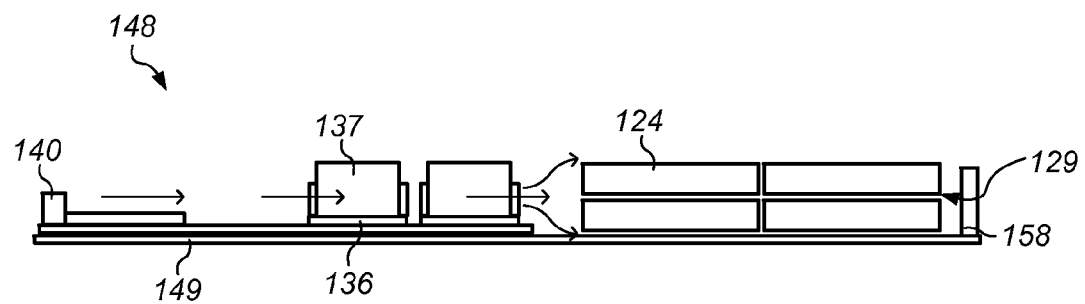
FIG. 4 is illustrates a schematic side view of a computing device.

FIG. 4 is illustrates a schematic side view of the computing device shown in FIGS. 3A and 3B. Computing device 148 includes motherboard assembly 120, hard disk drives 124, fans 158, and chassis 149. Hard disk drives 124 are stacked two drives high in each row of hard disk drives.

The arrows shown in FIG. 4 indicate possible air flow paths in computing device 148 for a front-to-back air flow arrangement. Air gaps 129 may be provided between the upper and lower tiers of disk drives, and above and below the array of disk drives. Air gaps may allow air flow across heat producing components of drives 124.

In certain embodiments, an on-board fan may provide cooling for two or more tiers of computing devices in a rack. For example, an on-board fan at the rear of shelf module 147 may provide cooling for computing devices in both the upper and lower tier of computing devices 148 installed in shelf module 147. In one embodiment, the height of the on-board fan is between 1.5U and 3U. In another embodiment, the height of an on-board fan is between 1U and 1.5 U.

Figure 5:
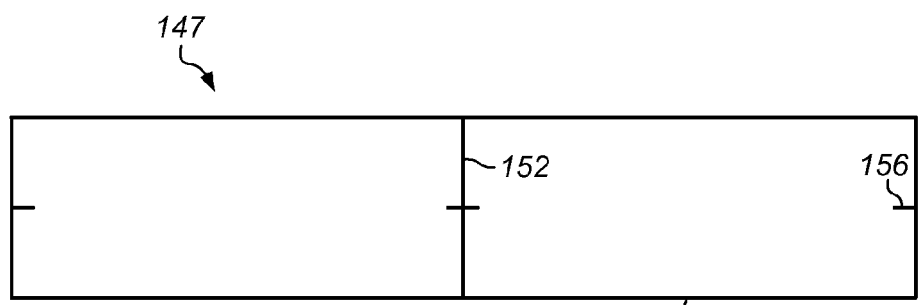
FIG. 5 illustrates one embodiment of a shelf module that can be used to support computing devices in a rack.

FIG. 5 illustrates one embodiment of a shelf module that can be used to support computing devices in a rack. Shelf module 147 includes divider 152, base shelf 154, and support rails 156. In one embodiment, shelf module 147 is mounted in slots in a standard 19-inch rack. Shelf module 147 may have a height of about 3U. In one embodiment, each of the four slots in shelf module 147 receives a computing device that is 1.5U or less and that has a width equal to or less than one-half the width of a standard 19-inch rack. In some embodiments, divider 152 can be adjusted from one position to another in shelf module 147. In some embodiments, support rails 156 are adjustable (for example, to adjust the height of the slots).

Shelf module 147 may be made of sheet metal or other suitable material or combination of materials. In one embodiment, the external walls of shelf module 147 have a uniform cross section as shown in FIG. 5 from the front edge of the shelf module to the back edge of the shelf module. In some embodiments, exterior walls and/or vertical members of a shelf module provide structural support, environmental protection, and EMI shielding for electronic devices in the computing devices.

In some embodiments, two or more partial width computing devices having separate chassis are mounted in a rack system side-by-side with one another and with one or more other components of a computing system. In one embodiment, a power supply unit for one or more partial-width computing devices is separately mounted to the side of one or more computing devices.

Figure 6A:
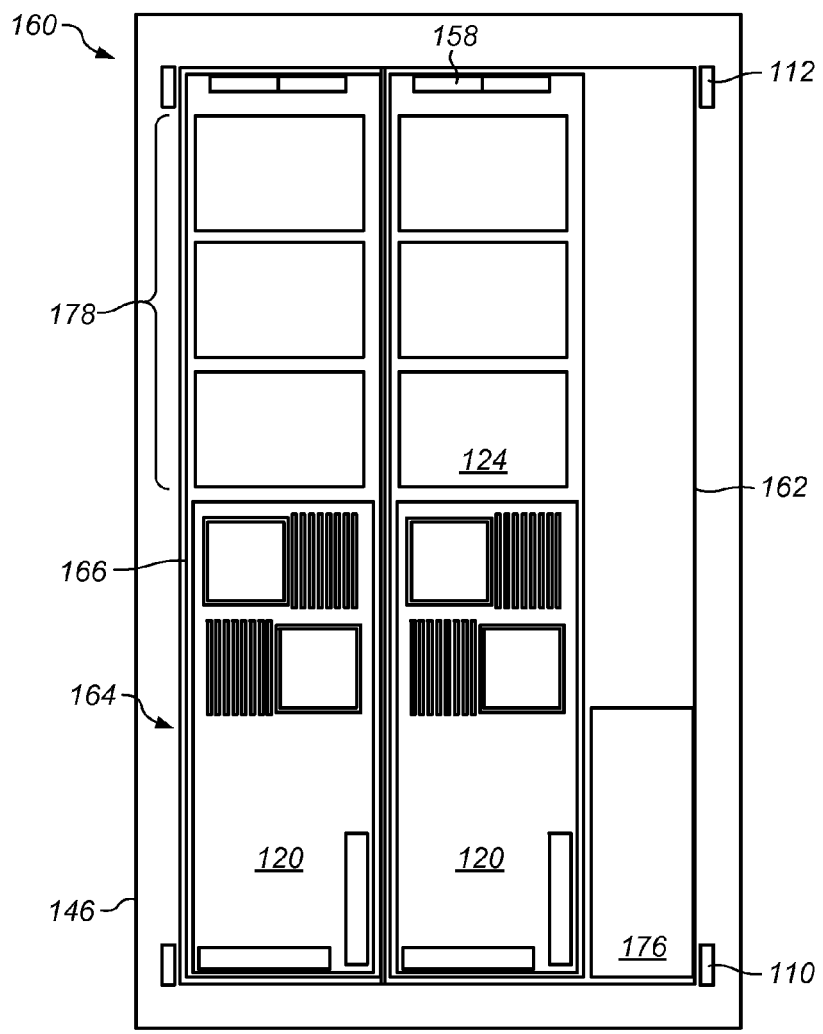
FIG. 6A and FIG. 6B are a top view and a front view, respectively, illustrating one embodiment of a computing system with partial width computing devices and a separate power supply unit.
Figure 6B:
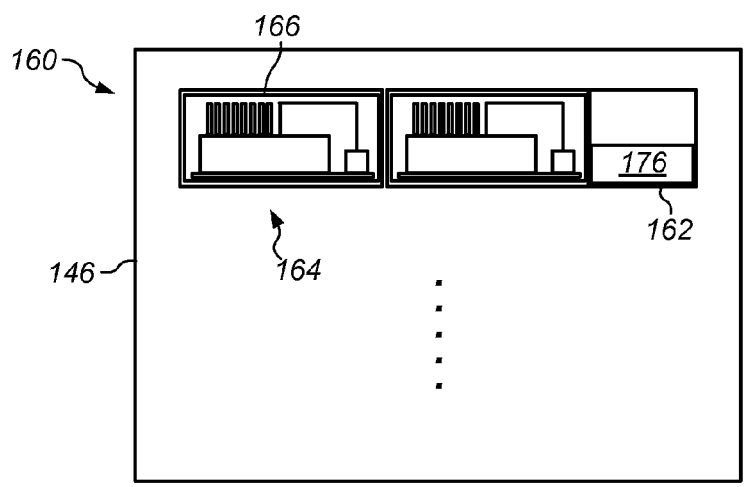

FIG. 6A and FIG. 6B are a top view and a front view, respectively, illustrating one embodiment of a computing system with partial width computing devices and a separate power supply unit. System 160 includes rack 146, shelf module 162, and computing devices 164. Shelf module 162 may mount be installed in rack 146 in any suitable manner, such as that described above relative to shelf module 147. Shelf module 162 includes two side-by-side slots for receiving computing devices 164.

Each of computing devices 164 includes chassis 166. Chassis 166 carries motherboard assembly 120, hard disk drives 124, and fans 158.

Shelf module 164 may hold power supply unit 176. Power supply unit 176 may supply electrical power for processors, hard disk drives, and other components of computing device 164. In certain embodiments, power supply unit 176 is mounted on a sled that slides in and out of a shelf module.

Hard disk drives 124 are arranged in row 178. In one embodiment, a stack hard disk drives may be provided in each position shown in FIG. 6A. In some embodiments, hard disk drives are mounted in a computing device in a cross-wise direction relative to the direction of installation of the computing device. For example, in FIG. 6A, hard disk drives 124 are mounted the length-wise direction of the hard disk drives runs perpendicular to the direction of installation of computing device 164.

Figure 7:
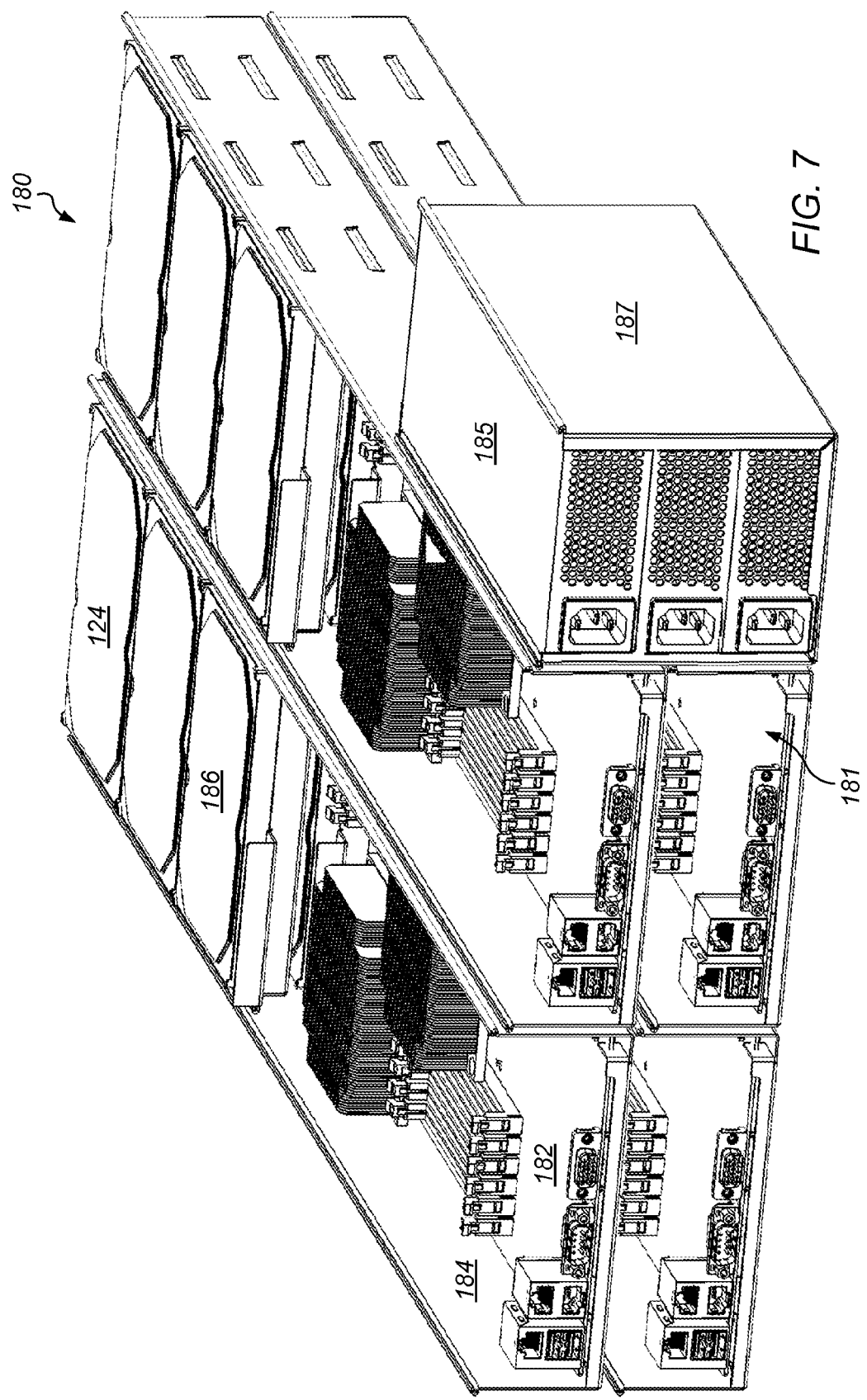
FIG. 7 illustrates one embodiment of a rack installation of computing devices and a power supply module having different heights.

In some embodiments, different devices installed over the width of one or more slots of a rack have different heights from one another. In certain embodiments, devices may combine across the width of the rack to fill a given number of slots in the rack. FIG. 7 illustrates one embodiment of a rack installation of computing devices and a power supply module having different heights. System 180 includes computing devices 181 and power supply module 185. Each of computing devices 181 includes a motherboard assembly 182 and chassis 184. In one embodiment, each of hard disk drive stacks 186 includes six 3.5 inch drives (3 stacks, each stack two high). Thus, each stack of two computing devices 181 creates a stack of hard disk drives four drives high.

Power supply module 185 includes a stack of three power supply units. The power supply units are held in power supply carrier 187. In one embodiment, each of the power supply units is a 1U power supply unit. Power supply module 185 may supply power to computing devices 181.

In one embodiment, each of computing devices 181 is about 1.5U and power supply module 185 is about 3U. Thus, the stacked computing devices 181 and the single power module 185 both take up the same amount of height in the rack.

Figure 8:
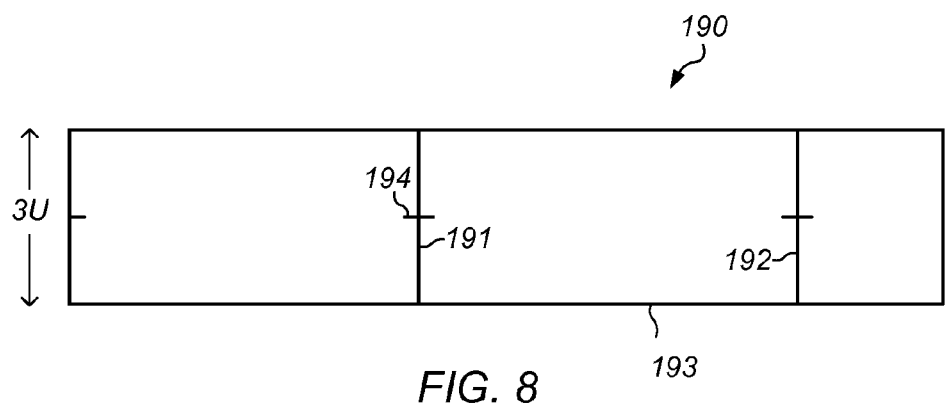
FIG. 8 illustrates one embodiment of a shelf module including separate slots for multiple partial width computing devices and a slot for a power supply module.

FIG. 8 illustrates one embodiment of a shelf module including separate slots for multiple partial width computing devices and a slot for a power supply module. The shelf module may support, for example, the system of partial-width computing devices and power module shown in FIG. 7. Shelf module 190 includes dividers 191 and 192, base shelf 193, and support rails 194. In one embodiment, shelf module 190 is mounted in slots in a standard 19 inch rack. Shelf module 190 may have a height of about 3U. In some embodiments, dividers 191 and 192 can be adjusted from one position to another in shelf module 104. In certain embodiments, support rails 194 are adjustable (for example, to adjust the height of the slots).

Figure 9:
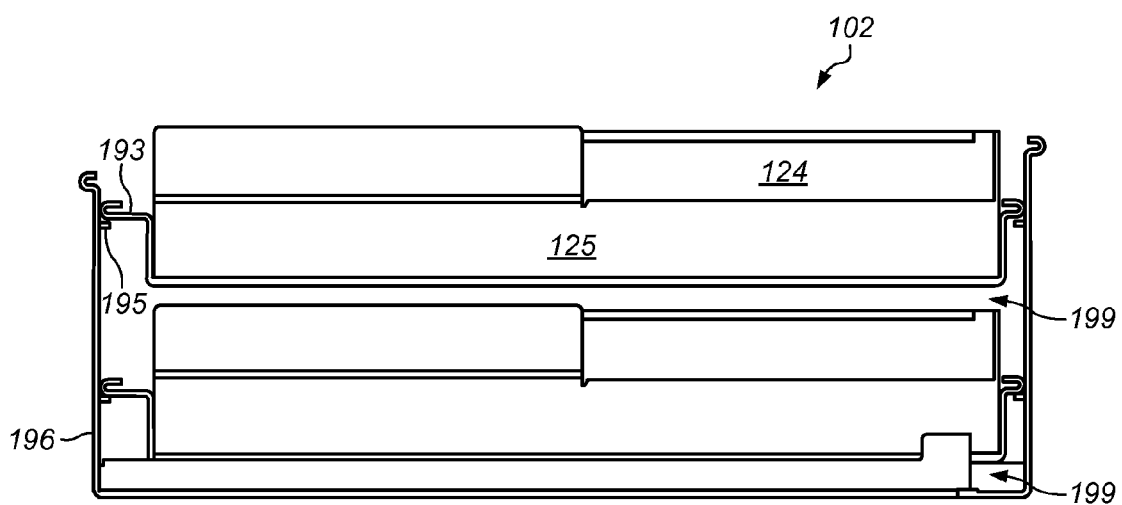
FIG. 9 is a front view a hard disk drive portion of a partial-width computing device according to one embodiment.

FIG. 9 is a front view a hard disk drive portion of a partial-width computing device according to one embodiment. Hard disk drives 124 are installed in hard disk drive trays 125. Chassis 126 of computing device 102 include ledges 195 for supporting hard disk drives 125 on guides 193. In some embodiments, hard disk drives are installed without any fasteners. In some embodiments, ledges 195 are formed as tabs in a sheet metal chassis. When trays 125 are installed, air gaps 199 may exist under each of the sets of hard disk drives. Air gaps 199 may allow air to pass across heat producing components in hard disk drives 124 and trays 125.

In some embodiments, each tier of hard disk drives can be removed without removing other hard disk drives in a computing device. For example, either of trays 125 may slide out the rear of computing device 102 without removing the other tray 125.

In some embodiments, all of hard disk drives 124 are of the same type, capacity, and form factor. In other embodiments, some of hard disk drives 124 are of different types, capacities or form factors than others of the hard disk drives.

In various embodiments, a rack system includes a combination of servers and related rack-mounted devices. In some embodiments, a computing system includes servers, one or more data switch devices, and one or more rack management switches in a common rack.

FIG. 10 illustrates one embodiment of a computing system including rack-mounted half-width computing devices and related rack mounted devices in a rack. System 200 includes rack 202, servers 204, data switch devices 206, and management switch 208. Each of servers 204 may fill a half-width, 1.5U slot in rack 202. Each of the two data switch devices 206 may fill a full-width 1U slot. Management switch 208 may fill a full-width 1U slot. At 1.5U of height per row of servers, 52 of servers 204 (26 rows×2 servers per row) may be accommodated in 39U of rack space (26 rows×1.5 Upper row). Combined with data switch devices 206 and management switch 208, the servers may fill a rack with 42U of rack space (39U+3U).

In some embodiments, the number of input/output ports of on network equipment in a rack matches the number of input/output connections on servers in the rack. FIG. 11 illustrates one embodiment of a computing system having data switch port capacity matching the number of computing devices in the rack. System 220 includes rack 202, servers 204, data switch devices 206, management switch 208, and power modules 210. Each of servers 204 may fill a half-width, 1.5U slot in rack 202. Each of two data switch devices 206, management switch 208, and power modules 210 may fill a full-width 1U slot. At 1.5U of height per row of servers, 48 of servers 204 (24 rows×2 servers per row) may be accommodated in 36U of rack space (24 rows×1.5 Upper row). The 48 servers 204, data switch devices 206, remote management device 208, and power modules 222, the servers may fill 42U of rack space (36U+6U). In some embodiments, remote management switch 208 is used to monitor, control, diagnosis, or manage servers. In one embodiment, management is implemented by way of an intelligent platform management interface ("IPMI") architecture.

Cables may be used to connect an input/output connection on each of servers with a corresponding input/output port on a data switch device. For the embodiment shown in FIG. 11, each of data switch devices 206 may have 24 input/output ports. With two data switch devices 206 in system 220, a total of 48 input/output ports are available to couple with input/output connections on each of the 48 servers 204. Thus, in this example, the number of input/output ports on the data switches matches the number of connections on the servers, leaving no unused input/output ports in the system.

In certain embodiments, a rack having 42U of rack space may be filled entirely with half width, 1.5U servers (28 rows of 1.5U in height, total of 56 servers).

In some embodiments, rack-mounted computing devices are cooled by a cooling air system that delivers air in bulk to the rack. To remove heat from computing devices installed in the rack, an air handling system may be operated to cause air to flow in computer room and through the rack system. As the air reaches the front of each of computing devices, the air may pass through the chassis of the computing devices. After passing through the chassis, the heated air may exit the rear of the rack system and flow out of the computer room. In certain embodiments, computing devices may have on board fans in addition to, or lieu of, a central cooling system. In certain embodiments, a rack may have a fan that supplies cooling air to all of the computing devices in the rack.

Figure 12:
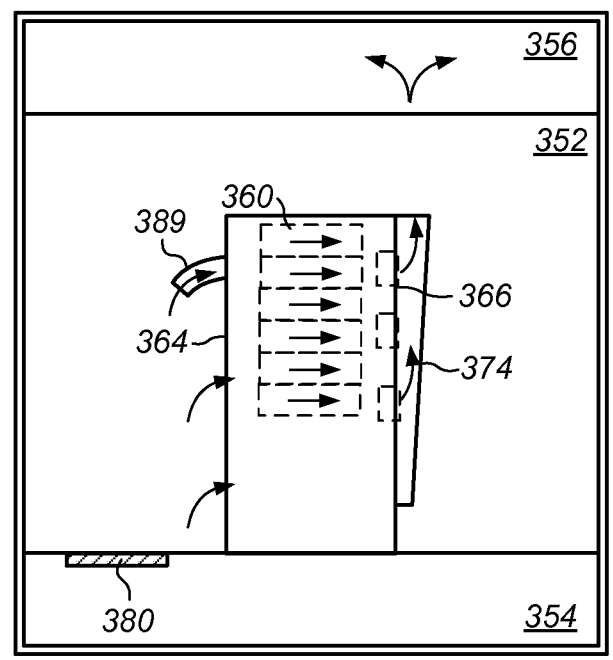
FIG. 12 illustrates one embodiment of removal of heat from computing devices in a computing system.

FIG. 12 illustrates one embodiment of removal of heat from computing devices in a computing system. Air may pass into computing room 352 from sub-floor plenum 354 by way of vent 380. Rear fans 366 in fan door 374 may draw air from front aisle 368 into rack 364, and through computing devices 360. Rear fans 366 may exhaust heated air out of the rack. The heated air may pass into ceiling plenum 356. Air directing device 389 is provided on the front or rack. Air directing device 389 may be used to promote airflow in particular devices mounted in the rack. Other arrangements of air movers may be included in various embodiments. U.S. patent application Ser. No. 12/646,417, "Air Directing Device for Rack System", filed Dec. 23, 2009; U.S. patent Ser. No. 12/751,212, "Rack-Mounted Air Directing Device with Scoop", filed Mar. 30, 2010; and U.S. patent application Ser. No. 12/886,440, "System with Rack-Mounted AC Fans", filed Sep. 9, 2010, each of which is incorporated by reference as if fully set forth herein, include other arrangements, systems, devices, and techniques that may be used in various embodiments for cooling or mounting computing devices, data storage devices and data control devices.

In various embodiments described above, each of the processors may operate as a separate computing device. In certain embodiments, however, circuit board assemblies on a dual-processor board may cooperate to function as a single computing device. In certain embodiments, two or more processors on a multiple processor circuit board assembly share access to some or all of the hard disk drives in a computing device.

Although in the embodiments described above, the hard disk drives were mounted on directly to chassis members, in various embodiments, hard disk drives or other data storage devices may be mounted to a chassis using other mounting elements. For example, hard disk drives may be mounted on square tubes that support the drives and raise the drives above the bottom of a chassis.

In some embodiments, a rack system includes rack-mounted fans external to computing devices in the rack. The rack-mounted fans may provide air flow through the computing devices.

Although in the embodiments described above, some of the computer devices have been described as being 3U in height, modules may in various embodiments be 2U, 4U, 5U, or 6U or any other height or dimensions.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A computing system, comprising:
a rack comprising a plurality of standard slots, wherein the rack is configured to receive a plurality of computing devices;
the plurality of computing devices comprising two or more half-width computing devices coupled to the rack, each respective half-width computing device of the two or more half-width computing devices having a height that is greater than 1 rack unit and less than 2 rack units, and each respective half-width computing device of the two or more half-width computing devices comprising:
a half-width chassis, wherein the respective half-width computing device comprising the half-width chassis is separately removable from a remainder of the two or more half-width computing devices coupled to the rack;
one or more circuit board assemblies in a primarily horizontal orientation coupled to the half-width chassis;
one or more processors coupled to at least one of the one or more circuit board assemblies; and
one or more stacks of two or more hard disk drives coupled to the half-width chassis;
wherein at least two of the two or more half-width computing devices are arranged vertically one over another in a ratio of 2 half-width computing devices per 3 rack-units of vertical rack space.

2. The system of claim 1, wherein, for the at least two of the two or more half-width computing devices arranged one over another, the height of each of the at least two half-width computing devices is 1.5U or less.

3. The system of claim 1, wherein, for the at least two of the two or more half-width computing devices arranged one over another, each of the at least two half-width computing devices is 1.5 rack units or less in height, and wherein the one or more stacks of hard disk drives in at least one of the at least two half-width computing devices comprises at least one stack of two 3.5 inch hard disk drives.

4. The system of claim 1, wherein, for at least another two of the two or more half-width computing devices, the at least another two half-width computing devices are arranged side by side in one or more slots in the rack.

5. The system of claim 4, further comprising a shelf configured to support the chassis of each of the two side-by-side half-width computing devices in the rack.

6. The system of claim 4, further comprising one or more power supply units coupled to the rack to one side of at least one of the two side-by-side half-width computing devices, wherein the power supply unit is configured to supply power to at least one of the two side-by-side half-width computing devices.

7. The system of claim 1, further comprising at least one air moving device configured to move air across heat producing components in the two or more computing devices.

8. A half-width computing device, comprising:
a half-width chassis;
one or more circuit board assemblies, in a primarily horizontal orientation, coupled to the half-width chassis;
one or more processors coupled to at least one of the circuit board assemblies; and
one or more stacks of two 3.5-inch hard disk drives coupled to the half-width chassis,
wherein the half-width computing device has a height more than 1U and not more than 1.5U,
wherein the half-width computing device is configured to couple into a rack comprising a plurality of standard slots such that at least 0.5U of height of one of the standard slots partially occupied by the half-width computing device is available for at least a portion of an additional device above or below the half-width computing device, and such that at least a portion of a width of one of the standard slots partially occupied by the half-width computing device is available for at least a portion of an additional device.

9. The half-width computing device of claim 8, wherein the height of the half-width computing device is about 1.5U.

10. The half-width computing device of claim 8, wherein at least one of the stacks of two 3.5-inch hard disk drives are mounted on the half-width chassis to the rear of at least one the processors.

11. The half-width computing device of claim 8, further comprising one or more rows of 3.5 inch hard disk drives coupled to the half-width chassis, wherein at least one of the stacks of two 3.5-inch hard disk drives is included in at least one of the rows.

12. The half-width computing device of claim 8, further comprising an arrangement of one or more rows of hard disk drives devices and one or more columns of hard disk drives, wherein at least one of the stacks of two 3.5-inch hard disk drives is included in at least one of the one or more rows.

13. The half-width computing device of claim 8, wherein at least one of the stacks of 3.5 inch hard disk drives is coupled to the chassis with the length of the 3.5 inch hard disk drives running perpendicular to the length of the half-width computing device.

14. The half-width computing device of claim 8, wherein the one or more processors comprise two or more processors coupled to the one or more circuit board assemblies, wherein at least two of the two or more processors are staggered across a width of the half-width computing device, wherein at least two rows of DIMMs are staggered across the width of the half-width computing device in a complementary fashion to the staggered two or more processors.

15. The half-width computing device of claim 8, further comprising one or more power supply units coupled to the half-width chassis, wherein at least one of the power supply units is configured to supply power to at least one of the processors or to at least one of the 3.5 inch hard disk drives.

16. The half-width computing device of claim 8, further comprising a power distribution board coupled to the half-width chassis, wherein at least one of the power distribution boards is configured to supply power to at least one of the processors or to at least one of the 3.5 inch hard disk drives.

17. The half-width computing device of claim 8, further comprising one or more fans coupled to the half-width chassis, wherein at least one of the fans is configured to move air across heat producing components of the half-width computing device.

18. A half-width chassis assembly, comprising:
a half-width chassis configured to receive:
one or more circuit board assemblies in a primarily horizontal orientation; and
one or more stacks of two 3.5-inch hard disk drives coupled to the half-width chassis; and
one or more mounting portions configurable to couple the half-width chassis in a rack comprising a plurality of standard slots,
wherein the half-width chassis assembly has a height more than 1U and not more than 1.5U,
wherein the half-width chassis is configured to couple into the rack such that at least 0.5U of height of one of the standard slots partially occupied by the half-width chassis is available for at least a portion of an additional device above or below the half-width chassis, and such that at least a portion of a width of one of the standard slots partially occupied by the half-width chassis is available for at least a portion of an additional device.

19. The half-width chassis assembly of claim 18, wherein the height of the half-width chassis assembly is about 1.5U.

20. The half-width chassis assembly of claim 18, further comprising a tray coupled to the half-width chassis, wherein the tray is configurable to hold at least one of the 3.5-inch hard disk drives in a stacked relationship above at least one other of the 3.5-inch hard disk drives.

21. The half-width chassis assembly of claim 18, wherein a tray is configurable to allow at least one of the 3.5 inch hard disk drives in at least one of the stacks to be removed separately from at least one other of the 3.5 inch hard disk drives in the at least one stack.

22. The half-width chassis assembly of claim 18, wherein a tray is configured to maintain at least one 3.5 inch hard disk drive in at least one of the stacks in a spaced relationship to at least one other 3.5 inch hard disk drive in the at least stack such that an air gap exists between at least two tiers of 3.5 inch hard disk drives in the at least one stack.

23. A system for holding computing devices in a rack, comprising:
one or more mounting portions configured to couple in one or more standard slots of a rack; and
a plurality of shelves coupled to the mounting portions in the one or more standard slots, wherein at least one of the shelves comprises a set of two or more half-width slots that are separate from the one or more standard slots, and wherein at least two of the plurality of shelves are arranged vertically one over another in a ratio of two shelves per three rack-units of vertical rack space,
wherein each of at least two of the two or more half-width slots is configured to hold a half-width computing device having a height more than 1 rack unit and less than 2 rack units, wherein at least two of the two or more half-width slots are configured to hold two or more half-width computing devices having primarily horizontal motherboard assemblies in a side-by-side relationship in the rack and such that the half-width computing devices can be independently slid in and out of the shelf system.

24. The system of claim 23, wherein each of at least one of the two or more half-width slots is configured to receive a chassis for a half-width computing device.

25. The system of claim 23, wherein the at least two shelves are configured to support two or more half-width computing devices at each of two or more levels.

26. The system of claim 23, wherein the at least two shelves are configured to support two levels of half-width computing devices having a combined height of about 3U.

27. The system of claim 23, wherein at least one or more of the plurality of shelves are configured to support one level of half-width computing devices having a height of about 1.5U.

28. The system of claim 23, wherein at least one or more of the plurality of shelves are configured to support two or more half-width computing devices and at least one power supply unit in a side-by-side arrangement in a standard slot of a rack.

29. The system of claim 23, at least one or more of the plurality of shelves further comprising one or more dividers between two or more of the half-width slots of the rack.

30. The system of claim 23, wherein a width of at least one of the two or more half-width slots for the half-width computing devices is adjustable relative to a separate width of the one or more standard slots to which the plurality of shelves are coupled.

31. The system of claim 23, wherein a height of at least one of the slots for the half-width computing devices is adjustable.

32. A system, comprising:
a rack;
two or more rack-mountable half-width computing devices installed in the rack, wherein each of at least two of the two or more rack-mountable half-width computing devices has a height that is greater than 1 rack unit and less than 2 rack units and comprises one or more stacks of hard disk drives, wherein each of the at least two of the two or more rack-mountable half-width computing devices comprises one or more data input/output connections;
one or more rack-mountable data switch devices installed in the rack, wherein the each of the data switch devices comprises a set of data input/output ports, wherein each of the data input/output ports in the set is configured to couple with a data input/output connection of the one or more data input/output connections on one of the two or more rack-mountable half-width computing devices; and one or more cables configured to couple the one or more data input/output connections on the two or more rack-mountable half-width computing devices with data input/output ports in the set of input/output ports on the one or more data switches, wherein, for at least a portion of height of the rack system, the two or more rack-mountable half-width computing devices are arranged vertically one over another in a ratio of 2 half-width computing devices per 3 rack-units of vertical rack space.

33. The system of claim 32, wherein the number of data input/output ports in the set of data input/output ports on the one or more data switches matches number of the input/output connections on the half-width computing devices installed in the rack such that there are no unused data input/output ports on the one or more data switches when the data input/output connections of the half-width computing devices are coupled to the data input/output ports of the one or more data switch devices.

34. The system of claim 33, wherein the system comprises two data switch devices having 24 data input/output ports each, wherein the computing devices include a combined total of 48 data input/output connections.

35. The system of claim 32, further comprising one or more rack-mounted rack management switches installed in one or more slots in the rack.

36. The system of claim 32, further comprising one or more rack-mounted power supply devices installed in one or more slots in the rack.

* * * * *